United States Patent [19]

Pan

[11] Patent Number: 4,511,813
[45] Date of Patent: Apr. 16, 1985

[54] DUAL-GATE MESFET COMBINER/DIVIDER FOR USE IN ADAPTIVE SYSTEM APPLICATIONS

[75] Inventor: Jing-Jong Pan, Melbourne, Fla.
[73] Assignee: Harris Corporation, Melbourne, Fla.
[21] Appl. No.: 532,520
[22] Filed: Sep. 15, 1983

Related U.S. Application Data

[63] Continuation of Ser. No. 273,046, Jun. 12, 1981, abandoned.

[51] Int. Cl.³ ........................ H03F 3/193; H03G 3/30
[52] U.S. Cl. ............................. 307/501; 307/241; 307/493; 307/498; 307/511; 330/277; 330/278; 333/104; 333/128; 357/22
[58] Field of Search ............... 307/493, 498, 511–513, 307/520, 522, 529, 568, 241–244, 501, 555, 556, 557, 304; 328/104, 105, 158, 159, 166; 330/277–278; 333/104, 127, 128; 357/22

[56] References Cited

U.S. PATENT DOCUMENTS

| | | | |
|---|---|---|---|
| 3,723,773 | 3/1973 | Adams et al. | 307/520 |
| 3,956,706 | 5/1976 | Saul | 307/511 X |
| 4,255,714 | 3/1981 | Rosen | 330/277 X |
| 4,291,278 | 9/1981 | Quine | 333/128 X |
| 4,308,473 | 12/1981 | Carnes | 307/243 X |
| 4,313,126 | 1/1982 | Krumm et al. | 357/22 |
| 4,379,264 | 4/1983 | Lenhardt | 307/512 X |
| 4,379,269 | 4/1983 | Ijichi | 330/278 X |
| 4,386,324 | 5/1983 | Schellenberg | 333/128 X |
| 4,390,851 | 6/1983 | Higgins et al. | 330/277 |
| 4,409,557 | 10/1983 | Sechi | 330/277 |

OTHER PUBLICATIONS

Liechti, "Performance of Dual-Gate GaAs MESFETs as Gain-Controlled Low-Noise Amplifiers and High-Speed Modulators", *IEEE Transactions on Microwave Theory and Techniques*, vol. MTT-23, No. 6, Jun. 1975, pp. 461–469.

Van Tuyl and Liechti, "High-Speed Integrated Logic with GaAs MESFETs", *IEEE Journal of Solid-State Circuits*, vol. SC-9, No. 5, Oct. 1974, pp. 269–276.

Primary Examiner—Stanley D. Miller
Assistant Examiner—D. R. Hudspeth
Attorney, Agent, or Firm—Antonelli, Terry & Wands

[57] ABSTRACT

A dual-gate MESFET forms the basic building block for a variety of signal coupling applications for use in adaptive microwave communication systems. By controlled biasing of its electrodes, a dual-gate MESFET may be operated as an active signal combiner/divider device. As such, it is capable of providing controlled signal transfer functions, so that it may be used in a variety of adaptive system applications including controlled switching devices, channelized power dividers, active channel fitters, phase shifters, complex weighting devices, etc.

27 Claims, 26 Drawing Figures $i_{ds} = y_m V_c$
$y_m = g_m e^{-jwc}$

DUAL-GATE MESFET COMBINER/DIVIDER FOR USE IN ADAPTIVE SYSTEM APPLICATIONS

This is a continuation of application Ser. No. 273,046 filed June 12, 1981 now abandoned.

FIELD OF THE INVENTION

The present invention relates to communication systems and, in particular, to microwave signal coupling components comprised of dual gate MESFETS for application to adaptive systems.

BACKGROUND OF THE INVENTION

With the advent and rapid growth of microprocessor technology, the present trend in the development of electronic systems and subsystems is an increasing use of adaptive techniques to optimize system needs and performance. Typically, each adaptive system requires one or more components such as complex weight devices for magnitude and phase adjustment of signals upon which the system operates. For example, a large-sized adaptive phased-array antenna requires several thousand complex weights in order to steer the antenna beam (or beams). For a system having such a large number of signal adjustment components, it goes without saying that the need for savings in energy, size and cost of the components has become a paramount concern, particularly in microwave communication systems where a variety of diverse elements are required to meet the functional demands of the system.

Conventional devices such as passive power combiner/dividers that have been employed in components such as phase shifters, complex weighting devices and switches, have been fabricated in a variety of configurations such as rat-race hybrids, edge couplers, interdigital couplers, branch line couplers and Wilkinson splitters. Disadvantageously, these passive types of components suffer from lack of gain, insertion loss and dividing loss, absence of reverse isolation and adjustability, and large physical size. As one example, PIN diodes, that have been conventionally used in complex weighting devices, are extremely lossy and suffer from high thermal noise, slow settling time, low dynamic range and poor tracking capability.

Presently, the trend in component fabrication is the use of monolithic microwave integrated circuits (MMIC), which offer low cost, miniaturization and high reliability. In such circuits, semiconductor material such as GaAs, InP and other III-V components are ideal substrates for making it possible to integrate a large number of components such as signal sources, modulators, mixers, amplifiers, multipliers, limiters, switches, etc. together to obtain these objectives. Unfortunately, the above-referenced conventional components do not lend themselves to monolithic integration with MMICs because of both material and diffusion process incompatibilities, in addition to their size and performance drawbacks.

SUMMARY OF THE INVENTION

In accordance with the present invention, the shortcomings of conventional passive components that have been used in adaptive microwave communication systems are overcome through the use of a dual-gate MESFET which forms the basic building block for a variety of signal coupling applications. By controlled biasing of its electrodes, a dual gate MESFET may be operated as an active signal combiner/divider device. As such, it is capable of providing controlled signal transfer functions, so that it may be used in a variety of adaptive system applications including controlled switching devices, channelized power dividers, active channel filters, phase shifters, complex weighting devices, etc.

In its basic configuration as a signal divider device, the dual-gate MESFET has one of its gate electrodes coupled to receive a microwave input signal to be divided or split and its source (or drain) electrode coupled to a source of reference potential (e.g. ground). A first split or divided output is derived from the second gate electrode and a second divided output is coupled to the drain (or source) electrode. For proper signal interfacing, impedance matching and biasing networks are coupled in the signal input/output ports. For a "channelized"" power divider application, reflection or transmission resonators may be coupled in parallel or in series with the output lines, respectively, for proper channel isolation. A plurality of dual-gate MESFET power dividers may be coupled together to form a series-branching divider. In this (or in the simplest) divider configuration, a power divider with N interconnected MESFETS will provide N+1 output channels.

For signal combining applications, the two gate electrodes of the dual-gate MESFET are coupled to receive first and second respective input signals, while a D.C. bias is applied to the source elctrode. A gain-combining power output is derived from the drain electrode of the MESFET. The gain, phase and stability factors of the active combiner or divider can be calculated and optimized using the device's three-port S-parameter.

As mentioned briefly above, this dual-gate MESFET-containing basic active signal combiner/divider building block of the present invention has numerous adaptive systems applications, such as switching devices, phase shifters and complex weighting devices. In an exemplary, common-source, application as a switching device, the dual-gate MESFET active signal combiner/divider may have a control input applied to one of its gate electrodes while an input and an output are coupled to the other of its gate electrodes and its drain electrode, respectively. The control input is used to switch the MESFET "on" and "off". During the "off" state, the input is completely decoupled from the drain. During the "on" state, an "amplified" input signal is provided at the drain. Additional signal coupling arrangements for switching aplications are available. The type of switching operation will depend upon the bias current conditions of the MESFET's electrodes.

The requirements of a complex weight are that the device be capable of shifting the phase and of varying the amplitude of the incoming signal. For this purpose several of the basic dual-gate MESFETS may be selectively interconnected through signal separation components such as hybrid couplers and controllably biased as variable gain amplifiers to form the complex weight. Another approach involves the use of either a single gate of dual-gate MESFET phase shifter with gain, containing a signal coupler made of the basic active combiner/divider building block, to form the complex weight.

Regardless of the application, the inventive use of a dual-gate MESFET as the basic microwave signal coupling component provides a device that enjoys a wide bandwidth for ECM, ECCM and wide band communication applications, wide dynamic range, and offers a considerable savings in size, cost and energy consumed

DETAILED DESCRIPTION

Figure 1:
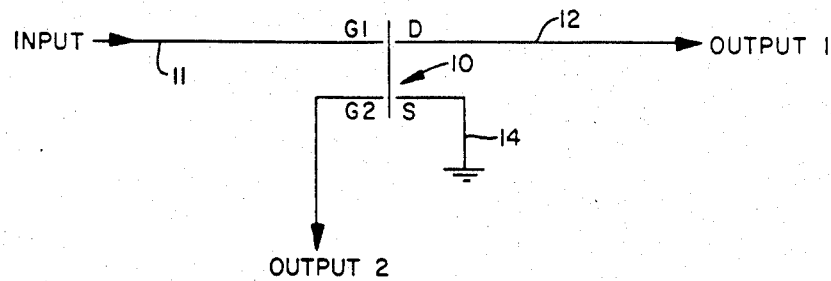
FIG. 1 is a simplified schematic diagram of an active power divider using a dual-gate MESFET.

Referring now to FIG. 1, there is shown a simplified schematic diagram of an active power combiner/divider employing a dual-gate MESFET in accordance with the present invention. The diagram is simplified to the extent that it is essentially intended to show the input and output connections for the device. Biasing and impedance matching networks that are normally coupled with the signal input and output lines and which have been omitted are, however, shown in FIG. 2, to be described below, which illustrates a practical embodiment of a signal combiner. The input/output connections for the dual-gate MESFET as shown in FIG. 1 correspond to those of a signal splitting or divider configuration.

More specifically, an input line 11, that would carry a microwave frequency (e.g. 7 GHz) signal to be split into a plurality of output signal portions, is coupled to a first gate $G_1$ of the dual gate MESFET 10. MESFET 10 may be any suitable commercially available dual-gate device, such as a Plessey Dugat 10/000 or NEC NE 463 packaged dual-gate device, suitable for X-band signal coupling applications. These devices have an $f_{max}$ of 50 GHz. The dual-gates of MESFET 10 correspond to gates G1 and G2, while the source and drain of MESFET 10 are identified by electrodes D and S, respectively. The source electrode S is coupled via line 14 to a fixed reference potential, e.g. ground as shown in FIG. 1. For deriving the split or divided output portions of the input signal on line 11, respective outputs are obtained from the drain electrode D and the other gate electrode G2. Namely, a first output line 12 is coupled from drain electrode D and a second output is coupled from gate electrode G2. The degree of separation or splitting of the input signal on line 11 into first and second output signals on lines 12 and 13, will depend essentially upon the relative biasing of these lines through bias networks (not shown) coupled thereto. Since the purpose of the simplified circuit diagram of FIG. 1 is merely to illustrate manner of coupling input/output lines to the dual-gate MESFET, such biasing will not be described here, but is presented in detail below in conjunction with the description of FIG. 2 which shows a more detailed diagram of the dual-gate MESFET active power combiner/divider, the input/output connections for which are intended for signal combining application.

Figure 2:
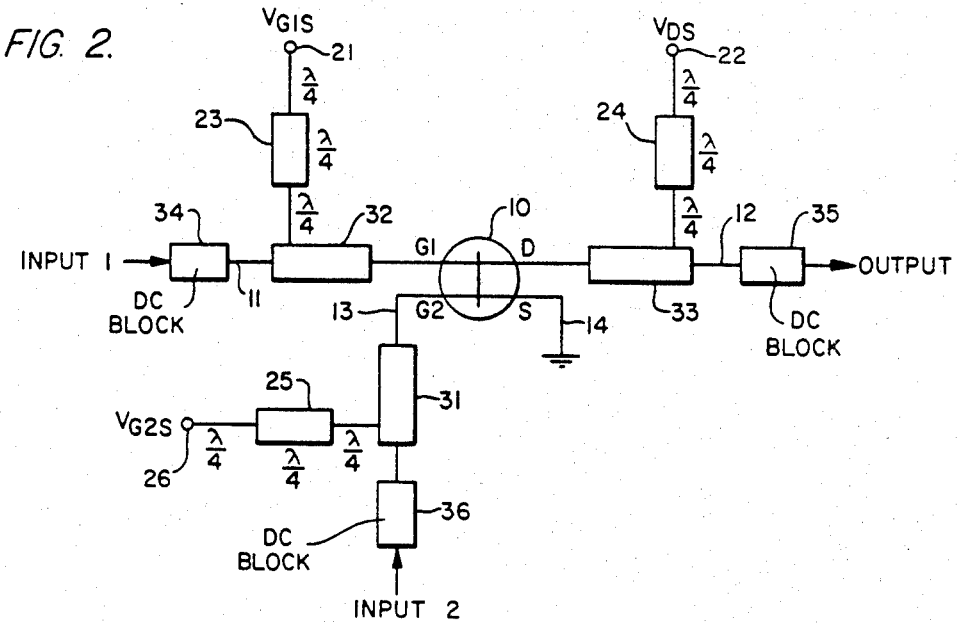
FIG. 2 is a schematic diagram of an active power combiner using a dual-gate MESFET.

Referring to FIG. 2, in addition to the dual-gate MESFET 10 having dual gate electrodes G1 and G2, source electrode S and drain electrode D, impedance matching and biasing networks are coupled with the input/output lines 11, 12 and 13. More particularly, coupled in input signal line 11 is a section of DC blocking microstrip 34. An impedance matching network 32 is coupled between the DC blocking microstrip section 34 and the first gate electrode G1 of the MESFET 10. Impedance matching network 32 may advantageously comprise an active matching impedance (such as one comprised of a single gate MESFET) to enhance MMIC fabrication and minimize chip size. Coupled with impedance matching network 32 is a first biasing microstrip section 23 that is connected between a DC bias terminal 21 and impedance matching network 32. A first DC bias $V_{G1S}$ is applied to terminal 21. The second input of the signal combiner is coupled over line 13 to the second gate electrode G2 of the MESFET 10. Like the first signal line 11, line 13 has disposed therein a DC blocking microstrip section 36 which is coupled to an impedance matching network 31. A second bias section 25 is coupled to a bias terminal 26 to which a bias voltage $V_{DS}$ is applied. The degree of amplification in the signal combining function of the circuit shown in FIG. 2 depends upon the bias voltages applied to terminals 21, 22 and 26. As an example, for input signals in a range of 7.25–7.75 GHz, with two equal power signals simultaneously applied to input lines 1 and 13, a peak gain combining power of 7.9 dB was observed at the output line 12, when the bias voltage $V_{G1S}$ applied to terminal 21 was −2.6 volts, the voltage $V_{DS}$ applied to terminal 22 was four volts and a voltage of −1.6 volts was applied to terminal 26, for a commercially available Plessey Dugat 10/000 MESFET.

The impedance matching/biasing networks that are coupled to the gate electrodes G1 and G2 and drain electrode D of the MESFET 10 in the embodiment shown in FIG. 2 may be comprised of high, low, high, $\lambda_{g/4}$ impedance lines, respectively, with the impedances being congruently matched and optimized using the device's S-parameter.

As mentioned above, the application of a dual-gate MESFET for microwave signal coupling applications in accordance with the present invention may be employed in either a signal divider or a signal combiner configuration. The circuit configuration shown in FIG. 2 may also be employed for signal dividing purposes, with the second output, rather than the second input, being derived from line 13, as described previously in conjunction with the simplified illustration of FIG. 1. In a power dividing configuration, again, using the above referenced commercially available Plessey Dugat device for MESFET 10, and a frequency range of 7.25-7.75 GHz, with a bias voltage of $V_{G1S}$ of $-1.45$ volts applied to terminal 21, a drain bias voltage $V_{DS}$ of 3.0 volts applied to terminal 22, and a second gate bias voltage $V_{G2S}=0.5$ V, the peak gain of 4.5 dB and a reverse isolation greater than 19 dB. By changing the biases to $V_{DS}=3.0$ V, $V_{G1S}=-1.25$ V and $V_{G2S}=0.5$ V, the peak gain becomes 8.3 dB at output line 13 and 6.5 dB at output line 12.

Figure 9:
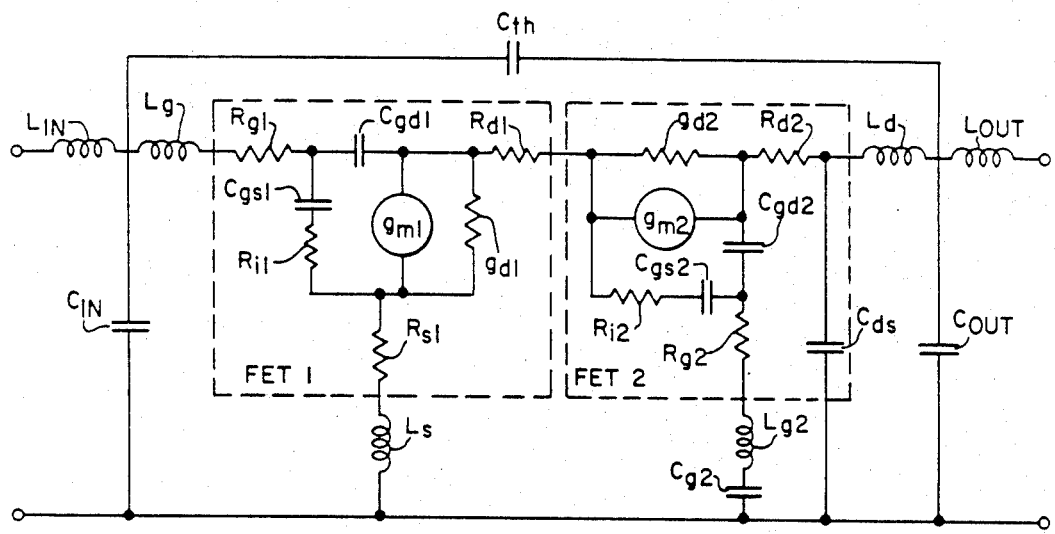
FIG. 9 is an equivalent circuit diagram of the dual-gate MESFETS of FIGS. 8A and 8B.

Namely, by simple varying the biasing conditions for the respective ports of the dual-gate MESFET, it is possible to provide different stable gain factors and signal separation characteristics. A more analytical description of this characteristic will be described below in connection with the equivalent circuit of a dual-gate MESFET as shown in FIG. 9.

Figure 3:
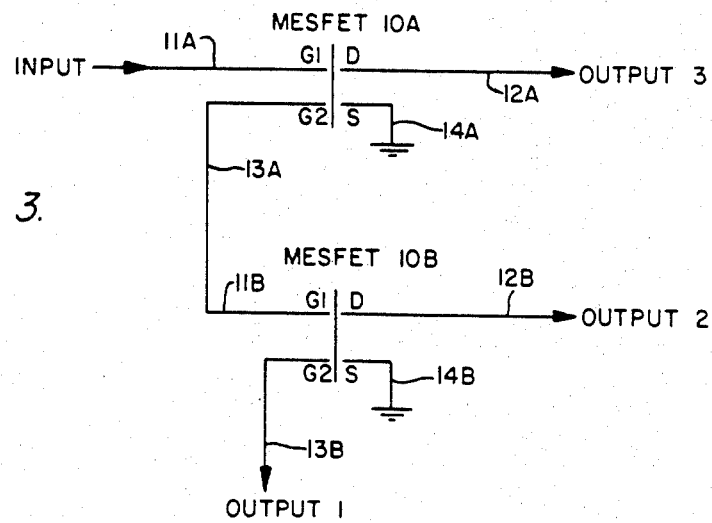
FIG. 3 is a simplified schematic diagram of an active multi-channel channelized power divider employing a plurality of cascaded dual-gate MESFETS.

FIG. 3 shows a simplified circuit diagram (similar to FIG. 1) of the manner in which a plurality of dual-gate MESFETS may be interconnected to provide a channelized power divider. Two MESFETS 10A and 10B are shown in FIG. 3 with the gate electrode G2 of MESFET 10A being connected over its output line 13A to the input line 11B and line 13BV which is connected to the second gate electrode G2 of MESFET 10B while second and third outputs are provided from the drain electrode D over line 12B from MESFET 10B and the drain electrode D over line 12A of MESFET 10A. The input is applied over input signal line 11A to the first gate electrode G1 of MESFET 10A. The source electrodes of each of the MESFETS 10A and 10B are coupled over respective lines 14A and 14B to a fixed reference voltage, specifically ground. While only two MESFETS 10A and 10B are shown in FIG. 3, it should be understood that additional MESFETS may be cascaded in the manner shown to provide additional outputs branching from the drain of each MESFET and a final output from the second gate of the last MESFET in the cascaded connections. With this configuration, N MESFETS will provide N+1 channel outputs. Of course, the proper impedance matching and biasing networks are to be included in the signal coupling lines for controlling the respective output ratios among the MESFET output lines. Such impedance matching and biasing networks detailed above in connection with the description of FIG. 2 have not been shown in FIG. 3 in order to simplify the drawing.

Figure 4:
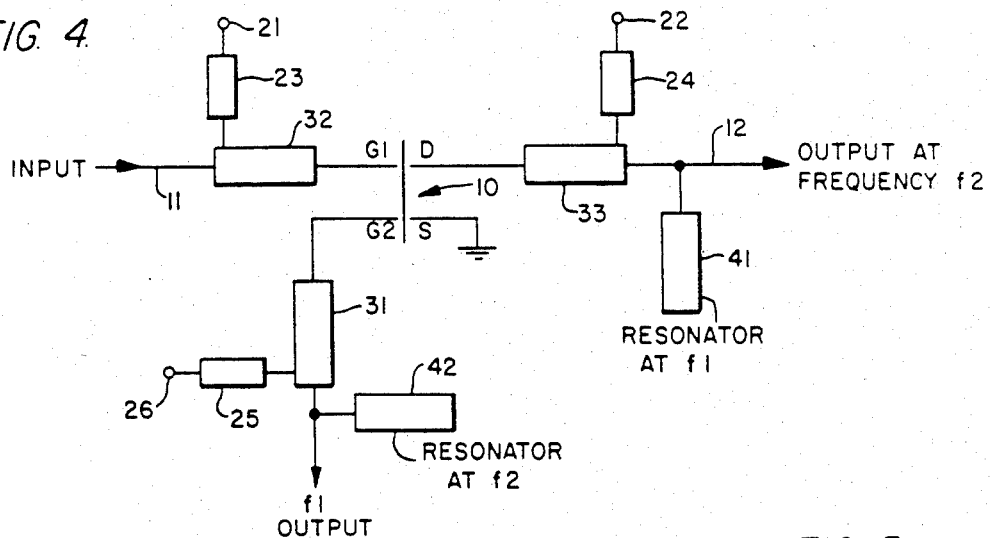
FIG. 4 is a schematic diagram of a dual-gate MESFET-containing active channelized power divider employing reflection resonators.
Figure 5:
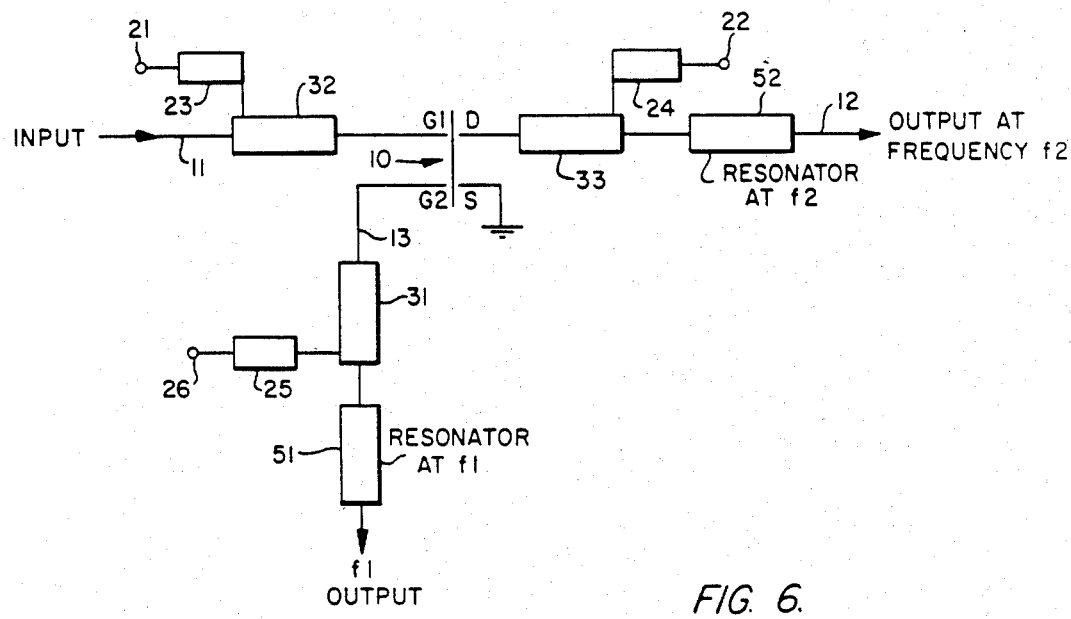
FIG. 5 is a schematic diagram of a dual-gate MESFET-containing active channelized power divider employing transmission resonators.

FIGS. 4 and 5 illustrate block diagrams of active channelized (two channels, f1 and f2) power dividers employing reflection resonator and transmission resonator components, respectively, for separating an incoming signal containing a pair of frequencies f1 and f2 into its separate components. Namely, like the active power combiner shown in FIG. 2, each of the power dividers shown in FIGS. 4 and 5 includes sets of impedance matching and biasing networks identified by the same reference numerals as in FIG. 2 and the same will not be described here. Additionally shown in FIG. 4 are a set of filters comprised of a first reflection resonator 41 tuned at frequency f1 and coupled to output line 12 from which an output frequency f2 is to be derived. Similarly, a reflection resonator 42 tuned to frequency f2 is coupled to output line 13 from which output frequency f1 is to be derived. These respective resonators ensure frequency isolation between the signals provided at output lines 12 and 13 so that their outputs are effectively separate channels of information wherein the input contains both frequencies f1 and f2.

Conversely, in the configuration shown in FIG. 5, serial transmission resonators tuned to the frequencies f1 and f2 may be provided in output lines 13 and 12, respectively. Namely, transmission resonator 51 tuned at frequency f1 is provided in line 13 whle transmission resonator 52 tuned to frequency f2 is provided in output line 12. The input signal applied over line 11 contains both frequencies f1 and f2 adn its components are separated from a gain standpoint by the biasing described above and from a frequency standpoint by the resonators provided in the respective output lines.

Figure 6:
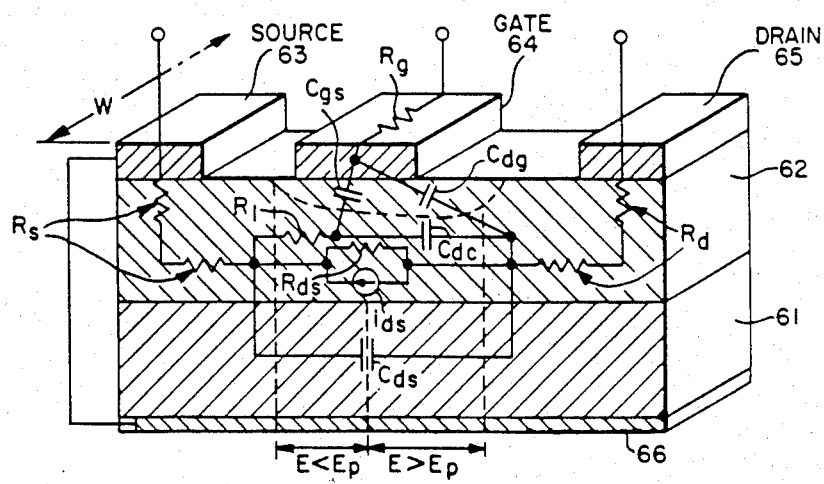
FIG. 6 is a perspective illustration of a single gate MESFET semiconductor device.
Figure 7:
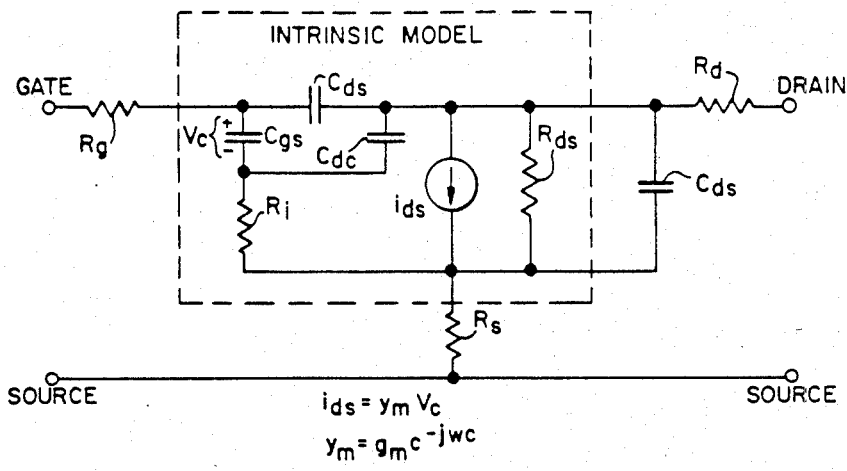
FIG. 7 is an equivalent circuit diagram of the single gate MESFET of FIG. 6.
Figure 8A:
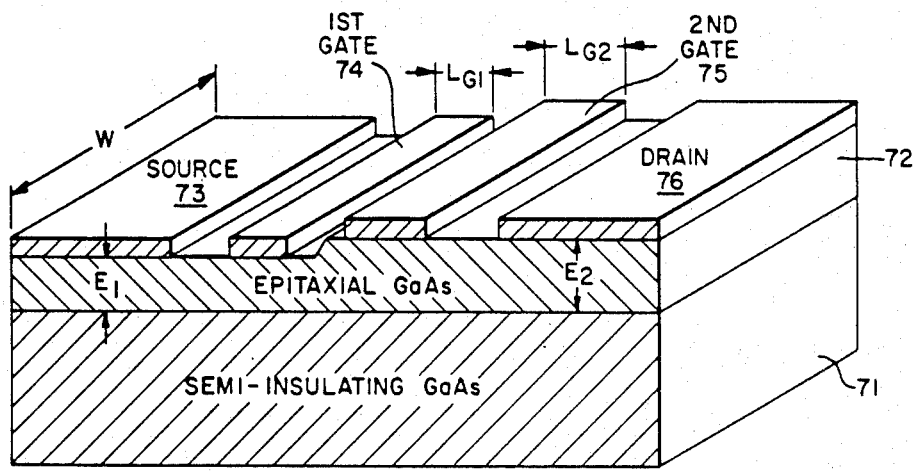
FIGS. 8A and 8B are perspective illustrations of respective dual-gate MESFETS of different active layer thicknesses.
Figure 8B:
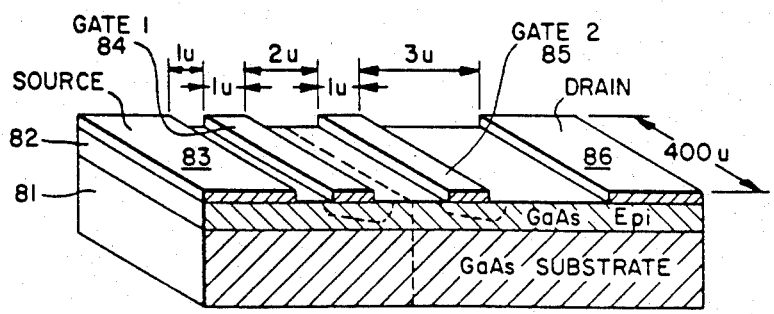

For an understanding of the operation of the dual-gate MESFET employed in the basic signal combiner/divider building block of the present invention, consider a comparison between a single gate MESFET, a cross-section of a semiconductor device ilustation of which is presented in FIG. 6 and a dual-gate MESFET, crosssssectional illustrations of semiconductor devices of which are shown in FIGS. 8A and 8B. FIG. 7 shows the equivalent circuit of the single gate MESFET configuration shown in FIG. 6, whle FIG. 9 shows the equivalent circuit of the dual-gate MESFET semiconductor device configuration shown in FIGS. 8A and 8B.

The single gate MESFET semiconductor device typically comprises a support layer 61 of chromium-doped semi-insulating material upon which active layer 62 of highly doped epitaxial gallium arsenide, for example, is formed. Atop the epitaxial layer are a source electrode 63, a gate electrode 64 and a drain electrode 65. A substrate electrode 66 is provided on support layer 61, as shown.

For the dual-gate MESFET configuration shown in FIG. 8A, a thin epitaxial gallium arsenide highly doped n-type layer 72 is formed atop a semi-insulating gallium arsenide base substrate 71. The doping of the thin layer 71 may be on the order of $2.5 \times 10^{17}$ cm$^{-3}$. Occasionally, a high resistivity buffer layer (5 microns thick and $1 \times 10^{13}$ cm$^{-3}$ concentration) may be provided between the active and semi-insulating layers 72 and 71 to provide a low noise figure. Epitaxial layer 72 has a first section of a first thickness E1 and a second section contiguous therewith of a second thickness E2, greater than thickness E1, as shown. A source electrode 73 and a first gate electrode 74 are provided atop the first relatively thin section of thickness E1 while a second gate electrode 75 and a drain electrode 76 are provided atop the relatively thick section having thickness E2.

In the emodiment shown in FIG. 8B, the epitaxial gallium arsenide layer 82 which is formed atop the gallium arsenide substrate 81 has the same thickness throughout with respect to source and drain layers 83 and 86 being formed together, with first and second gate layers 84 and 85 therebetween, ato the active layer 82. Each of the gate layers formed in the dual-gate MESFET embodiment may be formed of a relatively thin aluminum film or titanium-platinum-gold multicomponent film providing a Schottky contact to the gallium arsenide active layer with low resistivity. The respective source and drain electrodes may be comprised of eutectic compositions of gold and germanium to provide low resistance ohmic source and drain contacts. Of course, other materials such as indium-gold-germanium, nickel-gold-germanium and platnium-gold-germanium alloys may be employed.

A 1.0 micron dual-gate device having a cutoff frequency of 40 GHz typically has the following dimensions. The length of the first and second gates G1 and G2 on the order of 1.0 micron. The electrode separation between the source and the first gate G1 is on the order of one micron, that between the first gate and the second gate is on the order of three microns and that between the second gate G2 and the drain is on the order of seven microns. Typically, the gate width is on the order of 300 to 500 microns.

Figure 10:
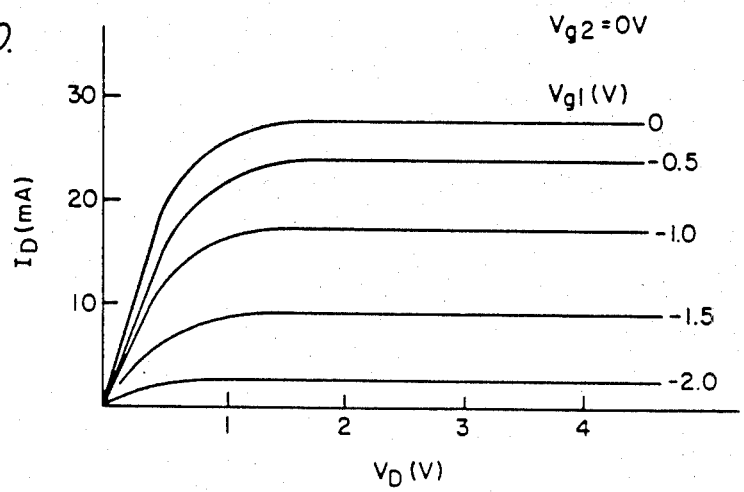
FIGS. 10 and 11 show current voltage characteristics of a dual-gate MESFET for respectively different bias voltages to one of the dual-gates.
Figure 11:
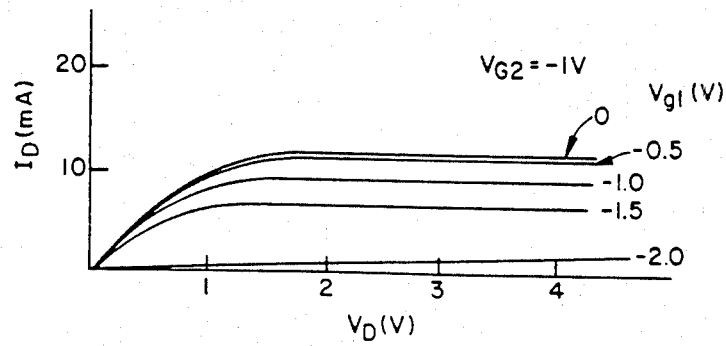

From an analysis standpoint, the dual-gate MESFET can be considered as two single-gate MESFETS. FIGS. 10 and 11 show typical static I-V characteristics of a dual-gate MESFET having different biases for the second gate electrode G2. An analysis of the electrical characteristics of the dual gate MESFET can be considered by referring to the equivalent circuits of the single gate and dual gate MESFETS shown in FIGS. 7 and 9.

As pointed out previously, the operational characteristics depend essentially upon the bais conditions for the individual MESFETS. The electrical parameters of the composite dual-gate MESFET can be expressed in terms of circuit elements. For example, the transconductance $g_{mk}$ and the drain conductance $g_d$ appearing at the first gate input may be defined as $$g_m = g_{m1}/\{1 + g_{m1}R_{s1} + g_{d1}(R_{s1}+R_{d1}) + g_{d1}(1+g_{d2}R_{d2})/(g_{m2}+g_{d2})\} \quad (1)$$

and, $$g_d = g_{d2}/\{1 + g_{d2}r_{D2} + (g_{m2}+g_{d2})(R_{s1}+R_{d1}) + (g_{m2}+g_{d2})(1+g_{m1}R_{s1})/g_{d1}\} \quad (2)$$

With these variables, the variations of $g_m$ and $g_d$ with $V_{GS1}$ as a function of $V_{GS2}$ can e calculated. The smaller feedback of the dual-gate MESFET, as contrasted to a single-gate MESFET, will result in a higher gain and better stability. The reverse transmission $(y_{12})_{dual}$ of a dual-gate MESFET may be calculated as follows:

$$(Y_{12})_{dual} = -j\omega C_{gd1} \frac{g_{d2}}{g_{m2}} - j\omega C_{th} \quad (3)$$

The value is reduced by a factor of $g_{d2}/g_{m2}$ compared with a single gate MESFET. The maximum stable gain (MSG), maximum available gain (MAG) and stability factor k can be computed from the three port S-parameter, or by the circuit elements themselves. Analytically stated, $$(MSG) = (MSG)_1 \cdot (MSG)_2 \quad (4)$$

-continued $$\cong \frac{g_{m1}}{\omega C_{gd1}} \cdot \frac{g_{m2}}{g_{d2}}$$

and $$k_{dual} = k_1 + 2\frac{\omega C_{gs2}}{g_{m2}} \quad (5)$$

Equations 4 and 5 indicate that the gain stability of a dual-gate MESFET out-performs a single-gate MESFET over a wide frequency range. Since a dual-gate MESFET can be considered as two single gate MESFETS having different stable gain factors at different bias voltages for the gates G1 and G2, the power combiner/divider described above can be simply configured and easily biased for controlling this transfer function. With the bias adjustability, both amplitude and phase among the input/output ports are tunable and can be optimized for desired system requirements.

The gain and phase of the active combiner (or divider) input/output can be calculated and optimized using the device's 3-port S-parameters. For convenience, the 3-port S-parameters may be converted into a two-part S-parameter when the third port is terminated with an impedance $Z_3$. As such, one calculates the parameters as follows:

$$S'_{ik} = S_{ik} + \left\{(S_{i3} \cdot S_{3k})/\left[\left(\frac{1}{\Gamma_3}\right) - S_{33}\right]\right\} \quad (6)$$

where $\Gamma_3$ is the reflection coefficient of load $Z_3$ with respect to the reference impedance $Z_o$.

$$\Gamma_3 = (Z_3 - Z_o)/Z_3 Z_o) \quad (7)$$

Then, the maximum available forward gain $G_f$ can be compared as $$G_f = \left|\frac{S'_{21}}{S'_{12}}\right| [k \pm (k^2 - 1)^{\frac{1}{2}}] \quad (8)$$

where k is the stability factor, and $$k = \frac{1 + |S_{11}' \cdot S_{22}' - S_{12}' \cdot S_{21}'|^2 - |S_{11}'|^2 - |S_{22}'|^2}{2|S_{12}'| \cdot |S_{21}'|} \quad (9)$$

The reverse isolation $G_r$ $$G_r = \left|\frac{S'_{12}}{S'_{21}}\right| [k \pm (k^2 - 1)^{\frac{1}{2}}] \quad (10)$$

the negative sign in front of the square root applies if $$1 - |S_{11}' \cdot S_{22}' - S_{12}' \cdot S_{21}'|^2 = |S_{11}'|^2 - |S_{22}'|^2 > 0 \quad (11)$$

In the foregoing description of exemplary embodiments of the dual-gate MESFET signal combiner/divider device of the present invention the signal coupling aspects of the dual-gate MESFET device were considered on the basis of separating on incoming signal into a plurality of output signals or combining a plurality of input signals into a common output signal. In each of these embodiments each gate electrode is employed either as an input electrode or as an output electrode. Pursuant to a further embodiment of the present invention, one of the gate electrodes of the dual-gate MESFET is employed as a control electrode and, by controlling its gate bias voltage, the gain of the MESFET can be varied over a fairly wide control range (as compared to conventional components). Moreover, for RF input signals there is a variation in phase through the device that depends upon the magnitude of the control voltage, so that the dual-gate MESFET may be operated as a phase shifter with gain. As such the present invention lends itself to phase shifter and complex weight device applications, as will be described in detail below.

More specifically, in phased-array antennas (including adaptive arrays, side lobe cancellors, null steering phased arrays, etc.) and adaptive systems, such as adaptive matched filters, adaptive noise reduction subsystems, adaptive spectrum analyzers, and adaptive feedback circuits, complex weighting devices that may be individually tailored to the signal processing functions are required. Each complex weight must be able to shift the phase and vary the amplitude of the incoming signal. Conventionally, it has been common practice to employ passive PIN diodes as the variable attenuators of which the weights are comprised. For a brief overview of exemplary systems in which such complex weighting devices may be employed, attention may be directed to the following U.S. PATS.: Piesinger, No. 4,152,702; King, 4,150,302; van Hegningen, 4,060,792; Norris, 4,041,496; Hemmi et al, 3,993,999; and Nemit 3,969,729. As described in this patent literature, the complex weighting systems typically contain one or more hybrids intercoupled with externally controlled attenuator elements (e.g. PIN diodes) to create the derived signal shaping function. Unfortunately, the PIN diode variable attenuator complex weight approach suffers from the previously enumerated disadvantages. Moreover, because of the loss contribution of a PIN diode attenuator, a high gain amplifier (or amplifiers) upstream of the diode is usually employed in order to provide the required signal strength. This, in turn, adds the further complexity and expense of a switch and a limiter to protect the high gain amplifier. This extra need of a switch, limiter and high gain amplifier undesirably increases the system cost.

In contrast to this cumbersome and costly conventional approach, the present invention forms the weighting device of a circuit configuration including the dual-gate MESFET building block described previously. As a result, there is obtained a weighting device that is not only cheaper and requires fewer attendant components (e.g. it eliminates the need for the limiter and switch) but is also capable of providing controlled gain, thereby reducing the high gain requirement of the RF amplifier. As will be described in detail below, the dual-gate MESFET-containing complex weight device according to the present invention may be configured to operate as a variable gain amplifier, or it may contain either a single-gate or dual-gate MESFET phase shifter with gain.

Figure 12:
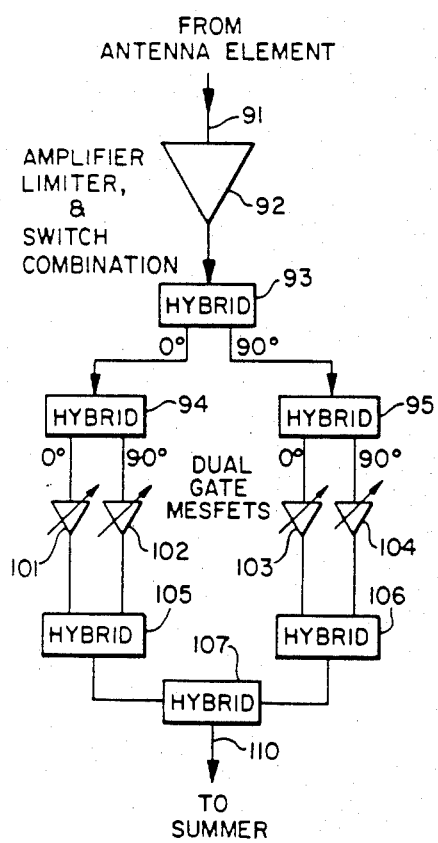
FIG. 12 shows a schematic block diagram arrangement of a complex weight arrangement for a phased array antenna.

More specifically, consider a phased array antenna system, containing a plurality of complex weighting elements in accordance with the present invention, as shown in FIG. 12. An output signal from an antenna element (not shown) is coupled over an input line 91 through amplifier 92 to a 90° hybrid 93. Zero and quadrature phase components of the input signal are coupled from hybrid 93 to a pair of additional 90° hybrids 94 and 95 from which additional in-phase and quadrature-phase signal components are derived. These signals are adjustably weighted by weighting elements 101-104 and then applied to further 90° hybrids 105 and 106. The outputs of weighting elements 101 and 102 are combined in hybrid 105 to provide a zero-phase combined signal whereas the outputs of weighting elements 103 and 104 are combined in hybrid 106 to produce a quadrature-phase combined signal. These respective signals are then combined in hybrid 107 to provide the final output signal on line 110. Conventionally, weighting circuits 101-104 have comprised PIN diodes and have required a much higher gain amplifier circuit for amplifier 92 and additional limiting and switching circuitry upstream of the high gain amplifier, as explained previously. Also, as mentioned briefly above, these diodes suffer from high thermal noise, slow settling time, low dynamic range and have poor tracking capability. Moreover, they are not readily integratable with other compnents of monolithic microwave integrated circuits. Pursuant to the present invention, weighting element 101-104 comprise gain-providing dual-gate MESFET circuits, an individual one of which is configured in the manner shown in FIG. 13, thereby eliminating the need for the extra costly components of the conventional approach.

Figure 13:
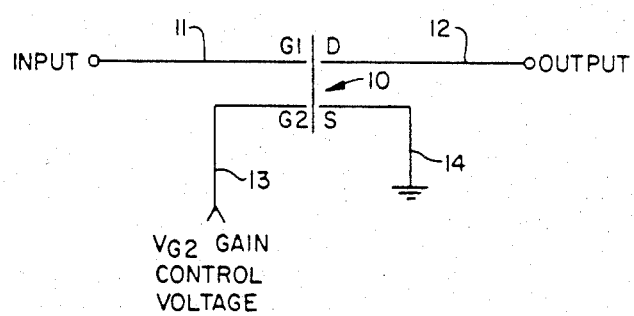
FIG. 13 is a simplified circuit diagram of a dual-gate MESFET containing variable gain amplifier for a complex weighting element.

FIG. 13 is a simplified circuit diagram (similar to FIG. 1) of the dual-gate MESFET used as a variable gain amplifier for the complex weighting element. Again, the impedance matching and bias microstrip sections have not been shown in order to simplify the circuit illustration. In accordance with the present embodiment, a first (gate electrode G1) of the dual-gate electrodes G1 and G2 is coupled to receive the input signal to be modified over line 11 and the drain electrode D is coupled over line 12 to a signal output terminal. The second gate electrode G2 is coupled over line 13 to receive a gain control bias voltage that determines the signal modifying properties of the complex weighting device. Advantageously, this dual-gate MSFET complex weighting device can provide both low noise amplification and variable control, simultaneously. By varying the second gate voltage $V_{G2}$ the gain of the amplifier can be changed over a range considerably wider than that afforded by conventional attenuator PIN diodes, with only a slight added phase-shift and input/output VSWR change.

Figure 14:
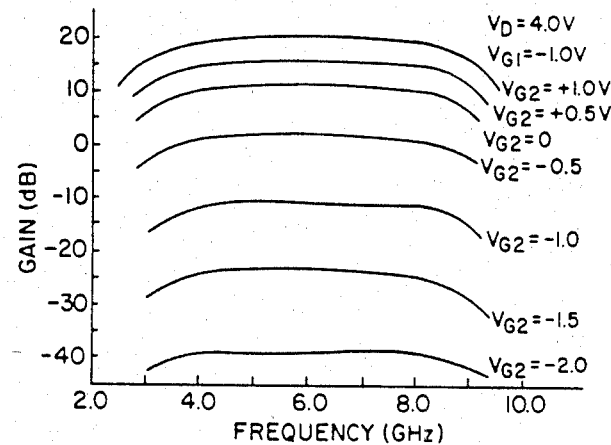
FIGS. 14, 15 and 16 illustrate measured operating performance characteristics for dual-gate MESFET complex weight devices for variations in control bias.
Figure 15:
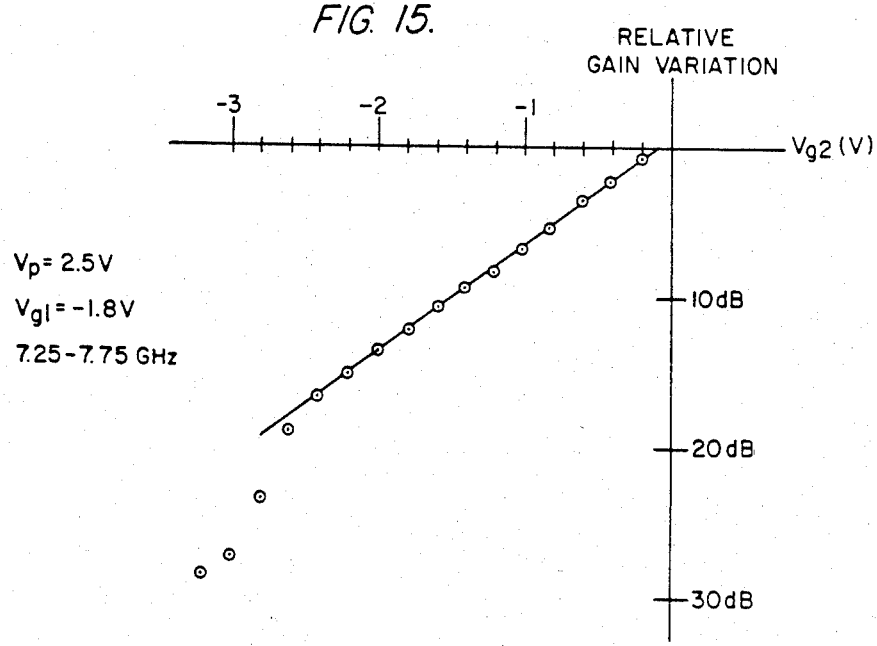
Figure 16:
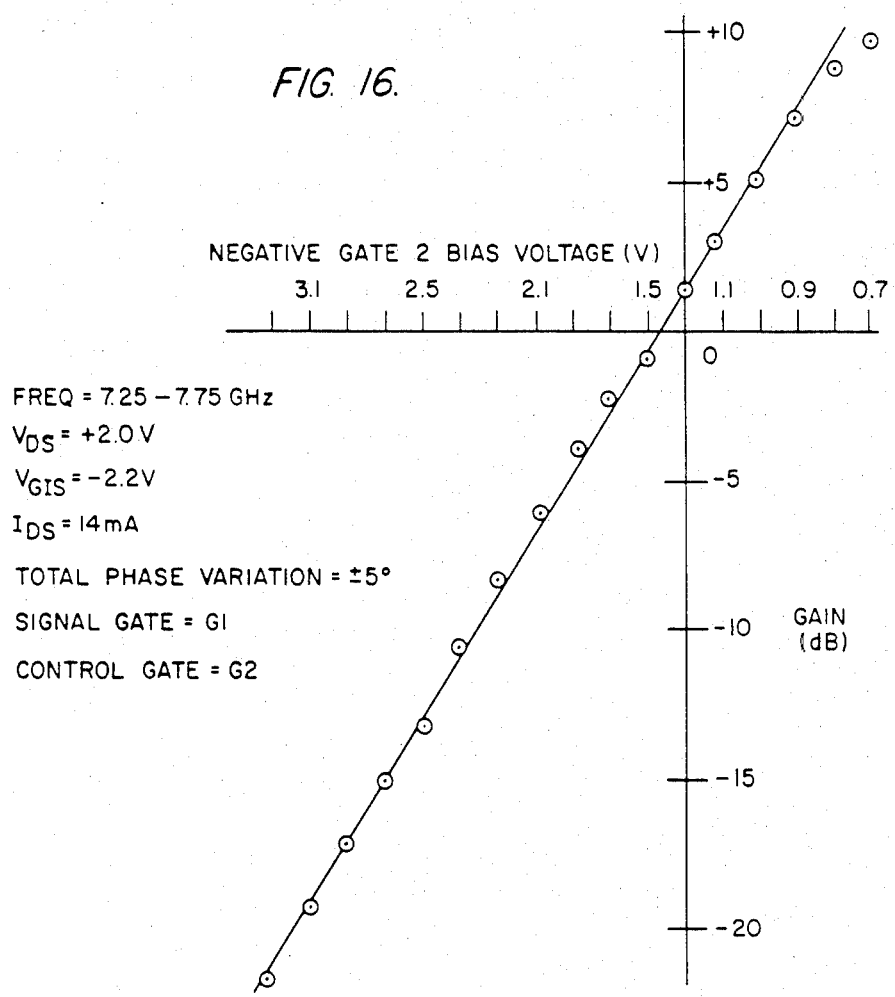

FIGS. 14, 15 and 16 show measured characteristics of dual-gate MESFETS for variations in the bias control voltage $V_{G2}$ applied to the second gate electrode of the variable gain amplifier shown in FIG. 13. As can be seen from FIG. 14 the gain characteristic is essentially flat over a substantial frequency range, on the order of 4.0 to 8.0 GHz for a large variation in the bias voltage $V_{G2}$ applied to the second gate voltage which produces an impressive 60 db range in gain. FIG. 15 shows the relationship between measured gain variation vs. $V_{G2}$ bias for the variable gain amplifier circuit configurtion of FIG. 13 using a commercially available NEC 46385 dual-gate MESFET, while FIG. 16 shows the relationship between measured gain variation vs. $V_{G2}$ bias for the variable gain amplifier circuit configuration of FIG. 13 using a Plessey-Dugat 10/000 dual-gate MESFET.

As can be seen from FIGS. 15 and 16, the variation in gain is effectively linear with the control voltage $V_{G2}$, with the variation in the second gate voltage $V_{G2}$ capable of providing a dynamic control range of more than 30 dB as contrasted to a range of only 10-18 dB for a conventional PIN diode attenuator.

Figure 17:
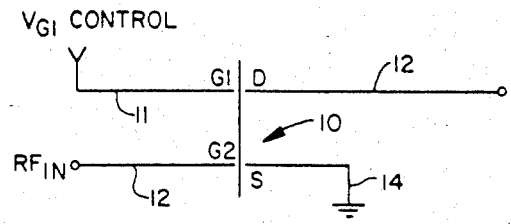
FIG. 17 illustrates a simplified circuit diagram of the input/output and control connections of dual-gate MESFET phase shifter.
Figure 18:
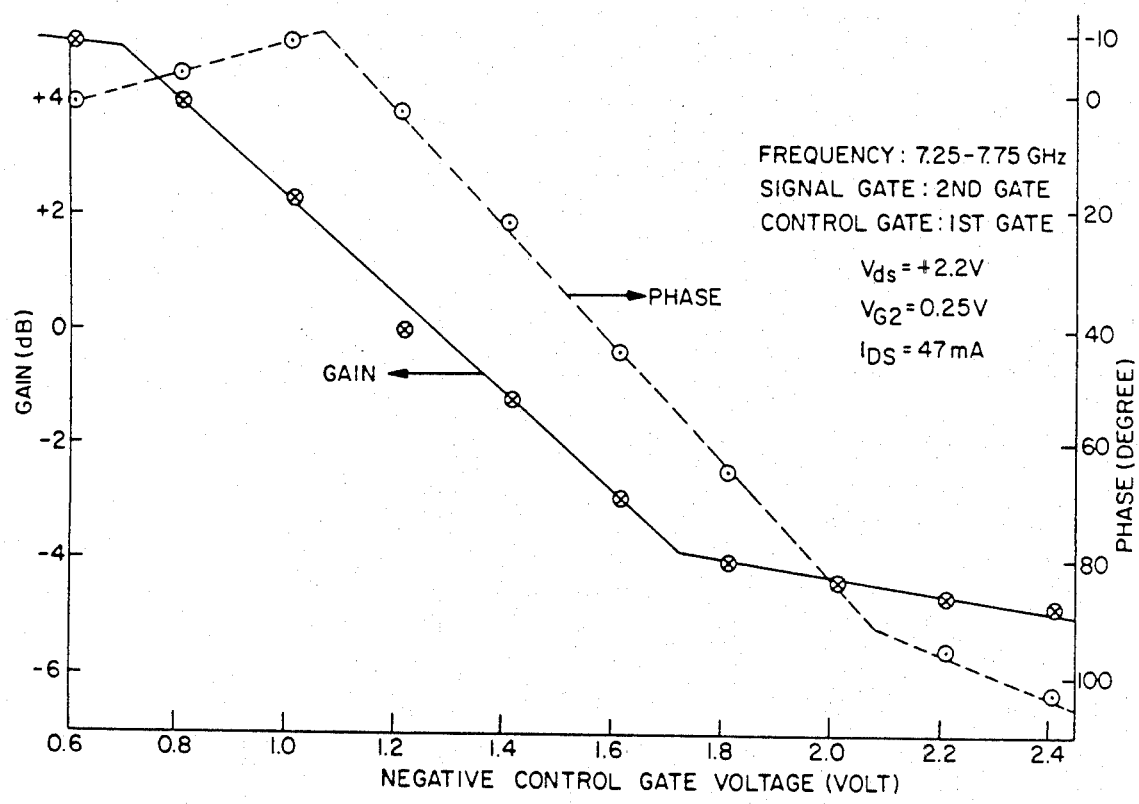
FIGS. 18 and 19 show respective linear and non-linear measured phase shift and gain characteristics for the dual-gate MESFET phase shifter of FIG. 17 for variatons in gate bias control voltage.
Figure 19:
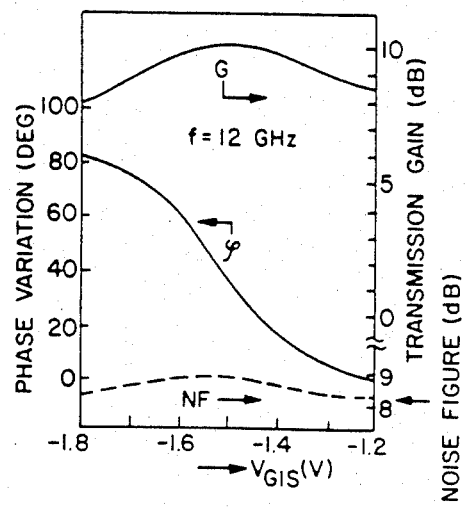

In addition to its capability of providing a complex weight component having a variable gain over a wide dynamic range by varying the control bias voltage $V_{G2}$ applied to the second gate electrode of the dual-gate MESFET, the basic building block of the present invention is also capable of forming a complex weight device that can vary both the amplitude and phase of the incoming signal. FIG. 17 illustrates a simplified (namely, omitting impedance matching and biasing microstrip sections) circuit diagram of the input/output and control connections for a dual-gate MESFET capable of providing both these functions. Again, as in the simplified circuit illustration of FIGS. 1 and 13, the signal output line 12 is derived from the drain electrode D while the source electrode S is coupled over line 14 to a reference potential, e.g. ground. The RF signal input, rather than being coupled to the first gate electrode G1 as in the variable gain amplifier of FIG. 13, is coupled over line 13 to second gate electrode G2. The control bias voltage $V_{G1}$, which provides for both a gain variation and a phase variation, is coupled over line 11 to the first gate electrode G1. FIG. 18 illustrates the measured phase shift and gain characteristics for a variation in bias control voltage $V_{G1}$ applied to the first gate electrode for the variable gain phase shifter circuit configuration of FIG. 17 employing a commercially available Plessey-Dugat 10/000 dual-gate MESFET. As can be seen from FIG. 18, the phase shifter provides more than 90° linear phase variation over a variable range of control bias voltage $V_{G1}$; hence, four MESFETS can be connected together to form a complex weight which is capable of providing a full 360° phase variation capability with a substantial dynamic range in gain variation. FIG. 19 shows the measured phase-shift and gain characteristics for a variation in bias control voltage $V_{G1}$ for the variable gain phase shifter circuit configuration of FIG. 17 which results in a non-linear characteristic, as shown. The non-linear behavior of the device is attained by selection of the derived bias conditions and reactance components that are coupled with the dual-gate MESFET. As shown in FIG. 19, this type of device provides a non-linear phase variation with a substantially smaller, and also non-linear, gain variation over a narrow control voltage range of 0.6 volts. However, with the large phase variation of substantially 90° over a fairly small control input range, an arrangement of such dual-gate MESFET devices can easily form a complex weight phase shifter.

With the above-described embodiments of the use dual-gate MESFET as a variable gain amplifier having substantial gain, but only slight phase shift (namely, the embodiment of FIG. 13) or as a variable gain phase shifter having substantial phase shift but smaller gain (namely, the embodiment of FIG. 17), it becomes possible to configure a complex weight device using one or more of such circuits in combination, depending upon the gain and/or phase variation capabilities desired. For example, where it is desired to be able to provide substantial gain and phase variations as an operational feature of the complex weight, then the weight may be configured of the respective circuits shown in FIGS. 13 and 17 coupled in series with each other. The dual-gate MESFET circuit of FIG. 13 provides substantial gain variation with limited phase variation, while the circuit of FIG. 17 provides substantial phase variation. Thus, the dynamic range of the complex weight can be increased dramatically by the proper selection and iterconnection of such dual-gate MESFET circuits.

Figure 20:
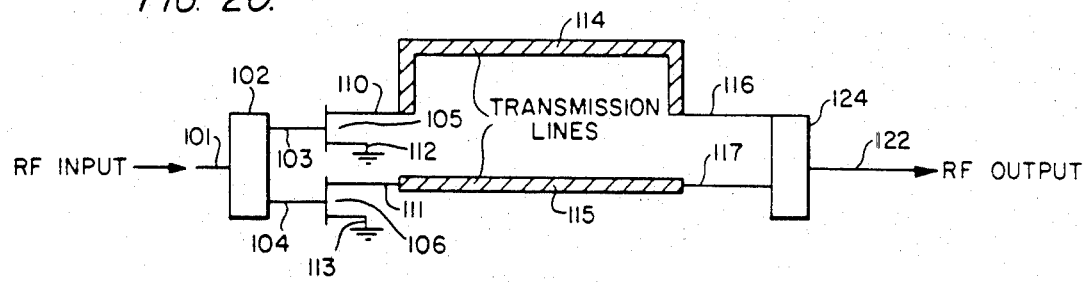
FIG. 20 shows an embodiment of a differential transmission line phase shifter using single gate MESFET switches.

FIG. 20 depicts a further embodiment of a MESFET phase-shifter, employing single-gate MESFETS for selectively switching different lengths of transmission line into the signal path to provide the desired phase change. More particularly, the RF input signal to which a controllable phase shift is to be imparted, is coupled over an input line 101 to a power divider/combiner device 102. Device 102 may be comprised of a dual-gate MESFET signal divider described above with reference to FIGS. 1 and 2, for example, and splits or divides the RF input signal on line 101 into first and second output signals in lines 103 and 104, respectively. Lines 103 and 104 are switchably coupled to a pair of transmission lines 114 and 115 of respectively different lengths. For this purpose, first and second single-gate MESFETS 105 and 106, operated by external switching control signals (not shown) are interposed between lines 103 and 114 and between lines 104 and 115, respectively. The gate of MESFET 105 is coupled to line 103 while its drain 110 is coupled to transmission line 114. The gate of MESFET 106 is coupled to line 104 while its drain is coupled to o line 104 while its drain is coupled to line 111. The source electrodes of MESFETS 105 and 106 are coupled via lines 112 and 113, respectively, to a fixed reference potential, e.g. ground. The switching control of MESFETS 105 and 106 may be effected by an externally supplied electrical control signal or by an optical control signal, for example, coupled to their respective gates. Transmission line 114 is coupled via line 116 to a first input of a signal combiner/divider 124, such as the dual-gate MESFET combiner shown in FIG. 2. Transmission line 115 is coupled via line 117 to a second input of combiner 124, the output of which is provided over line 122.

In operation, the incoming RF signal to be phase shifted is split into separate signal portions by unit 102. The degree of phase shift derived is imparted by the selected switching on of one of MESFETS 105 and 106 and thereby coupling the RF input to one of the transmission line sections 114 and 115. The degree of phase shift will depend upon the length of the transmission line section traversed by the RF signal, which is then coupled through signal combiner 124 to output line 122. In the present embodiment, each of units 102 and 124 is preferably implemented using the active dual-gate MESFET combiner/divider building block described in detail above. Not only does this yield the advantages described previously, but permits either digital or analog control of the switching elements. However, the power divider/combiner units may be passive devices, with the single-gate MESFET switches 105 and 106 being digitally controlled. It should also be observed that lines 116 and 117 may be either directly coupled to combiner unit 124 as shown in FIG. 20, or may be coupled through an additional pair of respective single-gate MESFETS to the inputs of the combiner.

Figure 21:
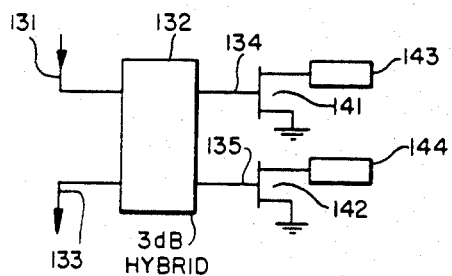
FIG. 21 illustrates an embodiment of a phase shift circuit employing a hybrid coupler having single gate MESFET reflection impedance switch elements.

FIG. 21 shows another embodiment of a phase shift circuit employing single-gate MESFETS and a dual-gate MESFET signal combiner/divider arrangement which is configured of a plurality of signal combiner/divider building blocks cascaded together as shown in FIG. 3, described previously. More particularly, the power combiner/divider unit 132 forms an active hybrid having an input line 131 and output lines 133, 134 and 135. Hybrid unit 132 may be comprised of a pair of dual-gate MESFETS cascaded together in the manner shown in FIG. 3. Lines 134 and 135 may be coupled to the respective drain electrodes of the pair of dual-gate MESFETS (10A and 10B in FIG. 3) and to the gates of respective single gate MESFETS 141 and 142. The drains of MESFETS 141 and 142 are coupled to bias networks 143 and 144. MESFETS 141 and 142 operate as negative resistance amplifier switches and are externally controlled, to selectively couple a prescribed negative resistance to lines 134 and 135. In their "on" states, single gate MESFETS operate as negative resistance reflection type amplifiers to impart a phase shift to the output signal on line 133 from the dual-gate MESFET hybrid 132. It should be noted here that the manner of controlling the switching of single-gate MESFETS is well-known, so that the control lines and signals therefor have been omitted from FIG. 21 as well as FIG. 20, described previously. In accordance with the embodiment of FIG. 21, since both single and dual-gate MESFETS are preferably employed for the signal coupling components, the advantages of MMIC fabrication and the performance characteristics described above are afforded. However, the hybrid coupler phase shifter of FIG. 21 may be realized using a passive 3 dB coupler for unit 132 in place of the preferred active dual-gate MESFET device.

Figure 22:
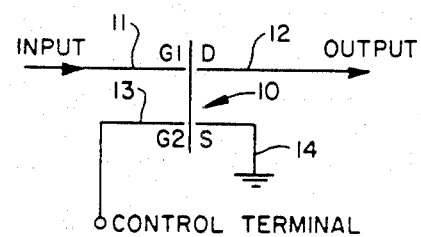
FIGS. 22-25 illustrate respective embodiments of signal switching devices employing the dual-gate active power combiner/divider of the present invention.

FIG. 22 shows a simplified schematic diagram of the application of the dual-gate MESFET building block of the present invention as a signal switching device. Again, for purposes of simplifying the drawing, the impedance matching and bias microstrip sections have been omitted. Basically, the MESFET is operated in a manner similar to the variable gain amplifier of FIG. 13, except that the control voltage applied to the second gate electrode G2 is used to turn the switch completely "on" or "off".

More specifically, as is shown in FIG. 14, referred to previously, the throughput/gain dual-gate MESFET configuration shown in FIGS. 13 and 22 depends upon the control bias voltage applied to the second electrode G2. In the configuration of FIG. 22, an RF signal is applied over line 11 to the first gate electrode G1 and the output is derived from the drain electrode D in line 12. The "on" state occurs at normal bias conditions for maximum gain operation. For example, for bias conditins of $V_{DS}=+4.0$ V, $V_{G1S}=2.0$ V and $V_{G2S}=0.7$ V the measured $S_{21}$ parameter showed a positive gain up to approximately 10 dB over an input frequency range of from 7.25 GHz–7.85 GHz. At the same time, the switch offers substantial reverse isolation. For example, the measured $S_{12}$ parameter for the above conditions showed a negative gain, or loss, (of up to approximately 20 dB over the frequency range). If the control gate electrode G2 is biased at or beyond the channel pinchoff voltage (e.g. a $V_{G2S}$ of 3.3 V), current flow through the MESFET is blocked and the switch is in the "off" state; namely, the measured $S_{21}$ parameter showed a negative gain or loss of up to approximately 26 dB over the same frequency range.

Figure 23:
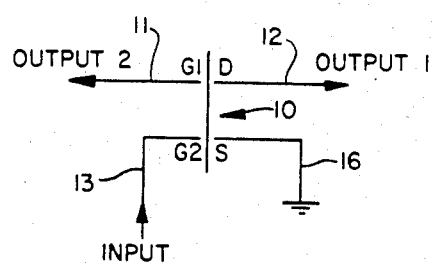
Figure 24:
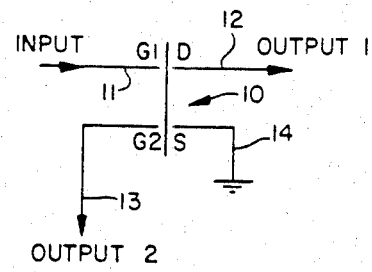

FIGS. 23 and 24 show additional switch configurations employing the dual-gate MESFET building block according to the present invention having a single input and two available outputs. The configuration shown in FIG. 23 has a single input coupled to the first gate electrode G1 and outputs derived from the drain D and second gate electrode G2. The configuration shown in FIG. 24 has a single input coupled to the second gate electrode G2 and outputs derived from the drain electrode D and the first electrode G1. The two output ports (drain D and gate G2 or drain D and gate G1) can be switched completely "on" and "off" depending on the bais control voltages $V_{DS}$, $V_{G1S}$ and $V_{G2S}$. Namely, the output ports 1 and 2 can be switched "on" simultaneously, "off" simultaneously, or one "off" and one "on", so as to provide whatever degree of signal coupling is needed by controlling the bias voltages applied to the electrodes of the dual-gate MESFET, as described above in conjunction with the description of the switching embodiment of FIG. 22.

Figure 25:
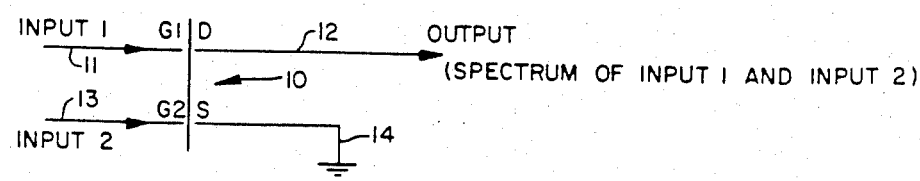

FIG. 25 shows a further switch configuration for receiving a pair of inputs at gates G1 and G2 and having a single output at drain D. Namely, using the signal combiner/divider building block shown in FIG. 2, and controlling the bias voltages for the signal coupling ports, i.e. $V_{G1S}$, $V_{G2S}$, and $V_{DS}$, the two inputs can be completely switched "on" or "off" simultaneously, or separately as described above in conjunction with the description of the switch embodiment of FIG. 22. Of course, the gains for inputs 1 and 2 will depend upon the bias voltages and can be the same or at separate gain levels.

As will be appreciated from the foregoing description of the present invention the use of a dual-gate MESFET signal combiner/divider building block element in RF communication systems offers a variety of signaling applications including phase shifters, channelized power dividers, complex weighting devices, controlled switching devices, etc. Because it may be fabricated using MMIC techniques, the present invention readily lends itself to monolithic integration and offers a substantial savings in cost and chip size, in addition to its superior performance characteristics over conventional components.

While I have shown and described several embodiments in accordance with te present invention, it is understood that the same is not limited thereto but is susceptible to numerous changes and modifications as known to those skilled in the art and I therefore do not wish to be limited to the details shown and described herein but intend to cover all such changes and modifications as are encompassed by the cope of the appended claims.

I claim:

1. A signal coupling device comprising:
    an input terminal to which an input signal to be divided into a plurality of output signals is to be coupled;
    a plurality of N output terminals from which respective ones of said output signals are to be derived; and
    a plurality of (N−1) dual-gate MESFETs, each having first and second gate electrodes, a source electrode and a drain electrode; and wherein
    the drain-source current path of each of said dual-gate MESFETs is connectable to a source of operating potential through a current conducting element;
    the first gate electrode of the first of said plurality of MESFETs is coupled to said input terminal;
    the first gate electrode of the second through (N−1)$^{th}$ MESFETs is coupled to the second gate electrode of the first through (N−2)$^{th}$ MESFETs, respectively;
    the second gate electrode of the (N−1)$^{th}$ MESFET is coupled to the N$^{th}$ output terminal; and
    said first through (N−1)$^{th}$ output terminals are respectively coupled to one of the source and drain electrodes of said first through $(N-1)^{th}$ MESFETs, respectively; and where N is an integer greater than two.

2. A signal coupling device according to claim 1, wherein the other of the source and drain electrodes of each of said dual gate MESFETS is coupled to a source of reference potential.

3. A controlled signal modifying device for varying at least one of the amplitude and phase of an input signal applied thereto comprising:

an input terminal to which said input signal is applied;

an output terminal from which the modified signal is derived;

first and second control terminals to which control biases are applied for controling the manner in which at least one of the amplitude and phase of said input signal is to be modified; and first and second dual-gate MESFETs each having first and second gate electrodes, a source electrode and a drain electrode; and wherein the drain-source current path of each of said dual-gate MESFETs is connectable to a source of operating potential through a current conducting element; and one of the first and second gate electrodes of said first dual-gate MESFET is coupled to said input electrode, the other of said first and second gate electrodes of said first MESFET is coupled to said first control terminal, one of the source and drain electrodes of said first MESFET is coupled to one of the first and second gate electrodes of said second dual-gate MESFET, the other of the first and second gate electrodes of said second dual-gate MESFET is coupled to said second control terminal, and one of the source and drain electrodes of said second dual-gate MESFET is coupled to said output terminal.

4. A controlled signal modifying device according to claim 3, wherein the other of the source and drain electrodes of said first and second dual-gate MESFETs are coupled to a prescribed reference potential.

5. A controlled signal modifying device according to claim 3, wherein the first gate electrode of said first dual-gate MESFET is coupled to said input terminal, and the second gate electrode of said first dual gate MESFET is coupled to said first control terminal, whereby a change in the control bias applied to said first control terminal causes a substantial change in the gain of said first MESFET, but only a minor variation in the phase of the input signal modified thereby.

6. A controlled signal modifying device according to claim 5, wherein the second gate electrode of said second dual-gate MESFET is coupled to the one of the source and drain electrodes of said first dual-gate MESFET and the first gate electrode of said second dual-gate MESFET is coupled to said second control terminal, whereby a change in the control bias applied to said second control terminal causes a substantial change in the phase of the input signal modified thereby.

7. A controlled signal modifying device according to claim 6, further comprising bias means, coupled to the first gate electrode of said first dual-gate MESFET, the second gate electrode and the source electrode of said second dual-gate MESFET, for supplying predetermined bias potentials thereto, thereby controlling the signal modifying action of each of said first and second dual-gate MESFETs in association with their respective control biases.

8. A controlled signal modifying device for controllably shifting the phase of an input signal applied thereto comprising:

an input terminal to which said input signal is applied;

an output terminal from which the phase-shifted output signal is derived;

signal splitting means, coupled to said input terminal for splitting said input signal into a plurality of separate signals;

a plurality of phase shifting means;

a plurality of MESFET switches coupled between said signal splitting means and said plurality of phase shifting means, for controllably coupling a selected one of said plurality of separate signals to a respective one of said phase shifting means; and wherein the drain-source current path of each of said MESFET switches is connectable to a source of operating potential through a current conducting element, the gate of each of said MESFET switches being respectively coupled to receive one of said plurality of separate signals and a switch control signal; and further including signal combining means having a plurality of inputs coupled to said phase shifting means and an output coupled to said output terminal.

9. A controlled signal modifying device according to claim 8, wherein said plurality of phase shifting means comprises plural sections of transmission line having respectively different lengths.

10. A controlled signal modifying device according to claim 8, wherein said signal splitting means comprises a dual-gate MESFET having a first gate connected to said input terminal and a second gate providing one of said separate signals of said signal splitting means, the drain-source current path of which dual-gate MESFET is connectable to a source of operating potential through a current conducting element.

11. A controlled signal modifying device according to claim 8, wherein said signal combining means comprises a dual-gate MESFET having first and second gates connected to respective ones of said plurality of phase shifting means, the drain-source current path of which dual-gate MESFET is connectable to a source of operating potential through a current conducting element.

12. A controlled signal modifying device according to claim 8, further comprising a further plurality of MESFET switches coupled between said plurality of phase shifting means and the plurality of inputs of said signal combining means for controllably coupling a selected one of the phase shifting means to a respective input of said signal combining means, and wherein each of said further plurality of MESFET switches has a gate coupled to an output of a respective one of said plurality of phase shifting means and its drain-source current path connectable to a source of operating potential through a current conducting element.

13. A controlled signal modifying device for controllably shifting the phase of an input signal applied thereto comprising;

an input terminal to which an input signal is applied;

an output terminal from which a phase-shifted output signal is derived;

a hybrid coupler having an input coupled to said input terminal, an output coupled to said output terminal and a pair of signal coupling terminals; and a pair of controlled negative resistance MESFETs coupled to said signal coupling terminals, for controlling the phase shift of the input signal coupled through said hybrid coupler, and wherein each of said MESFETs has its drain-source current path connectable to a source of operating potential through a current conducting element.

14. A controlled signal modifying device according to claim 13, wherin said hybrid coupler comprises a pair of cascaded dual-gate MESFETs, a first gate of one of said pair of dual-gate MESFETs being coupled to said input terminal, a first gate of the other of said pair of dual-gate MESFETs being coupled to said output terminal, and a second gate of each of said one and the other dual-gate MESFETs being coupled together, the drain-source current path of each of said dual-gate MESFETs being connectable to a source of operating potential through a current conducting element.

15. An electrically controlled switch comprising:
   an input terminal;
   a first output terminal;
   a second output terminal;
   a dual-gate MESFET having a source electrode, a drain electrode coupled to said first output terminal, and a first gate electrode coupled to said second output terminal, and a second gate electrode coupled to said input terminal, the drain-source current path of said MESFET being connectable to a source of operating potential through a current conducting element; and
   bias means, coupled to said first and second gate electrodes, said source electrode and said drain electrode, for controlling the degree of coupling from said input terminal to each of said output terminals by controllably applying prescribed bias potentials between said source electrode and said first and second gate and drain electrodes.

16. A signal coupling device comprising:
   an input terminal to which an input signal to be divided into first and second output signals is to be coupled;
   a first output terminal from which said first output signal is to be derived;
   a second output terminal from which said second output signal is to be drived; and
   a dual-gate MESFET having first and second gate electrodes, a source electrode and a drain electrode, the drain-source current path being connectable to a source of operating potential through a current conducting element; and wherein
   said first gate electrode is coupled to said input terminal, said second gate electrode is coupled to said second output terminal and one of said source and drain electrodes is coupled to said first output terminal; and further comprising
   bias means, coupled to said first and second gate electrodes and said one of said source and drain electrodes, for supplying predetermined bias potentials thereto and thereby controlling preselected characteristics of said first and second output signals; and wherein
   said preselected characteristics include the ratio of the magnitude of said first output signal to said second output signal.

17. A signal coupling device comprising:
   an input terminal to which an input signal to be divided into first and second output signals is to be coupled;
   a first output terminal from which said first output signal is to be derived;
   a second output terminal from which said second output signal is to be derived; and
   a dual-gate MESFET having first and second gate electrodes, a source electrode and a drain electrode, the drain-source current path of said MESFET being connectable to a source of operating potential through a current conducting element; and wherein
   said first gate electrode is coupled to said input terminal, said second gate electrode is coupled to said second output terminal and one of said source and drain electrodes is coupled to said first output terminal; further comprising
   respective D.C. blocking elements coupled between said input terminal and said first gate electrode, between said first output terminal and said one of said source and drain electrodes, and between said second output terminal and said second gate electrode, and
   respective impedance matching networks coupled between said D.C. blocking elements and the respective electrodes of said dual-gate MESFET to which said D.C. blocking elements are coupled, and wherein
   each of said D.C. blocking elements comprises a section of D.C.-blocking microstrip.

18. A signal coupling device according to claim 17, wherein said respective impedance matching networks are comprised of respective signal-gate MESFETs, the drain-source current path of each of which is connectable to a source of operating potential through a current conducting element.

19. For use in a microwave signal processing network wherein an input signal is coupled to a plurality of complex weighting devices and subjected to a controlled degree of amplutude and/or phase modification, the outputs of said complex weighting devices being combined with one another, a respective one of said complex weighting devices comprising:
   an input terminal to which said input signal is applied;
   an output terminal from which the modified signal is derived;
   a control terminal to which a control bias is to be applied for controlling the manner in which the phase and/or amplitude of said input signal is to be modified; and
   a dual-gate MESFET having first and second gate electrodes, a source electrode and a drain electrode, the drain-source current path of said dual-gate MESFET being connectable to a source of operating potential through a current conducting element; and wherein
   one of said first and second gate electrodes is coupled to said input electrode, the other of said first and second gate electrodes is coupled to said control terminal and one of the source and drain electrodes is coupled to said output terminal.

20. A complex weighting device according to claim 19, wherein said first gate electrode is coupled to said input terminal and said second gate electrode is coupled to said control terminal, whereby a change in said control bias causes a substantial change in the gain of said MESFET but only a minor variation in the phase of said input signal modified thereby.

21. A complex weighting device according to claim 19, wherein said second gate electrode is coupled to said input terminal and said first gate electrode is coupled to said control terminal, whereby a change in said control bias causes a substantial change in the phase of the input signal modified thereby.

22. A signal coupling device comprising:
a first input terminal to which a first input signal is to be applied;
a second input terminal to which a second input signal is to be applied;
an output terminal; and
a dual-gate MESFET having first and second gate electrodes, a source electrode and a drain electrode, the source-drain path of said MESFET being connectable to a source of operating potential through a current conducting element; and wherein
said first gate electrode is coupled to said first input terminal, said second gate electrode is coupled to said second input terminal, and one of said source and drain electrodes is coupled to said output terminal; and further comprising
respective D.C. blocking elements coupled between said first input terminal and said first gate electrode, between said second input terminal and said second gate electrode, and between said one of said output terminal and said one of said source and drain electrodes, and
respective impedance matching networks coupled between said D.C. blocking elements and the respective electrodes of said dual-gate MESFET to which said D.C. blocking elements are coupled, and wherein
each of said D.C. block elements comprises a section of D.C.-blocking microstrip.

23. A controlled signal modifying device for controllably shifting the phase of an input signal applied thereto comprising:
an input terminal to which said input signal is applied;
an output terminal from which the phase-shifted output signal is derived;
signal splitting means, coupled to said input terminal, for splitting said input signal into a plurality of separate signals;
a plurality of phase shifting means;
switching means, coupled between said signal splitting means and plurality of phase shifting means, for controllably coupling a selected one of said plurality of separate signals to a respective one of said phase shifting means; and
signal combining means having a plurality of inputs coupled to said phase shifting means and an output coupled to said output terminal.

24. A controlled signal modifying device according to claim 23, wherein said signal splitting means comprises a dual-gate MESFET having a first gate connected to said input terminal and a second gate providing one of said separate signals of said signal splitting means, the drain-source current path of which dual-gate MESFET is connectable to a source of operating potential through a current conducting element.

25. A controlled signal modifying device according to claim 23, wherein said signal combining means comprises a dual-gate MESFET having first and second gates connected to respective ones of said plurality of phase shifting means, the drain-source current path of which dual-gate MESFET is connectable to a source of operating potential through a current conducting element.

26. A controlled signal modifying device according to claim 23, wherein said plurality of phase shifting means comprises plural sections of transmission line having respectively different lengths.

27. A controlled signal modifying device according to claim 23, further comprising a further plurality of MESFET switches coupled between said plurality of phase shifting means and the plurality of inputs of said signal combining means for controllably coupling a selected one of the phase shifting means to a respective input of said signal combining means, the source-drain current path of each of said MESFET switches of said further plurality of MESFET switches being connectable to a source of operating potential through a current conducting element.

* * * * *